United States Patent
Dhuse et al.

(10) Patent No.: US 10,782,921 B2
(45) Date of Patent: Sep. 22, 2020

(54) NON-WRITING DEVICE FINALIZATION OF A WRITE OPERATION INITIATED BY ANOTHER DEVICE

(71) Applicant: International Business Machines Corporation, Armonk, NY (US)

(72) Inventors: Greg R. Dhuse, Chicago, IL (US); Ravi V. Khadiwala, Bartlett, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 307 days.

(21) Appl. No.: 15/415,537

(22) Filed: Jan. 25, 2017

(65) Prior Publication Data

US 2018/0210651 A1   Jul. 26, 2018

(51) Int. Cl.
*G06F 12/00* (2006.01)
*G06F 3/06* (2006.01)
*H04L 29/08* (2006.01)
*H03M 13/15* (2006.01)
*H03M 13/00* (2006.01)

(52) U.S. Cl.
CPC ............ *G06F 3/067* (2013.01); *G06F 3/0619* (2013.01); *G06F 3/0653* (2013.01); *G06F 3/0658* (2013.01); *H04L 67/1095* (2013.01); *H04L 67/1097* (2013.01); *H03M 13/1515* (2013.01); *H03M 13/616* (2013.01)

(58) Field of Classification Search
CPC ...... G06F 3/067; G06F 3/0619; G06F 3/0653; G06F 3/0658; H04L 67/1095; H04L 67/1097; H03M 13/1515; H03M 13/616
See application file for complete search history.

(56) References Cited

U.S. PATENT DOCUMENTS

| 4,092,732 A | 5/1978 | Ouchi |
| 5,454,101 A | 9/1995 | Mackay et al. |
| 5,485,474 A | 1/1996 | Rabin |
| 5,774,643 A | 6/1998 | Lubbers et al. |

(Continued)

OTHER PUBLICATIONS

Shamir; How to Share a Secret; Communications of the ACM; vol. 22, No. 11; Nov. 1979; pp. 612-613.

(Continued)

*Primary Examiner* — Prasith Thammavong
(74) *Attorney, Agent, or Firm* — James Nock; Andrew D. Wright; Roberts, Calderon, Safran & Cole, P.C.

(57) ABSTRACT

A method includes sending a read threshold number of access requests to storage units regarding a set of encoded data slices. The method further includes receiving access responses from at least some of the storage units in response to the read threshold number of access requests. The method further includes determining, from the access responses, that writing of the set of encoded data slices to a set of storage units has not been finalized. The method further includes determining whether the computing device can finalize the writing of the set of encoded data slices on behalf of a source that initiated the writing. When the computing device can finalize the writing, the method further includes determining one or more finalization steps for completing the writing and executing the one or more finalization steps to complete the writing of the set of encoded data slices.

20 Claims, 7 Drawing Sheets

(56) References Cited

U.S. PATENT DOCUMENTS

| | | | |
|---|---|---|---|
| 5,802,364 | A | 9/1998 | Senator et al. |
| 5,809,285 | A | 9/1998 | Hilland |
| 5,890,156 | A | 3/1999 | Rekieta et al. |
| 5,987,622 | A | 11/1999 | Lo Verso et al. |
| 5,991,414 | A | 11/1999 | Garay et al. |
| 6,012,159 | A | 1/2000 | Fischer et al. |
| 6,058,454 | A | 5/2000 | Gerlach et al. |
| 6,128,277 | A | 10/2000 | Bruck et al. |
| 6,175,571 | B1 | 1/2001 | Haddock et al. |
| 6,192,472 | B1 | 2/2001 | Garay et al. |
| 6,256,688 | B1 | 7/2001 | Suetaka et al. |
| 6,272,658 | B1 | 8/2001 | Steele et al. |
| 6,301,604 | B1 | 10/2001 | Nojima |
| 6,356,949 | B1 | 3/2002 | Katsandres et al. |
| 6,366,995 | B1 | 4/2002 | Vilkov et al. |
| 6,374,336 | B1 | 4/2002 | Peters et al. |
| 6,415,373 | B1 | 7/2002 | Peters et al. |
| 6,418,539 | B1 | 7/2002 | Walker |
| 6,449,688 | B1 | 9/2002 | Peters et al. |
| 6,567,948 | B2 | 5/2003 | Steele et al. |
| 6,571,282 | B1 | 5/2003 | Bowman-Amuah |
| 6,609,223 | B1 | 8/2003 | Wolfgang |
| 6,718,361 | B1 | 4/2004 | Basani et al. |
| 6,760,808 | B2 | 7/2004 | Peters et al. |
| 6,785,768 | B2 | 8/2004 | Peters et al. |
| 6,785,783 | B2 | 8/2004 | Buckland |
| 6,826,711 | B2 | 11/2004 | Moulton et al. |
| 6,879,596 | B1 | 4/2005 | Dooply |
| 7,003,688 | B1 | 2/2006 | Pittelkow et al. |
| 7,024,451 | B2 | 4/2006 | Jorgenson |
| 7,024,609 | B2 | 4/2006 | Wolfgang et al. |
| 7,080,101 | B1 | 7/2006 | Watson et al. |
| 7,103,824 | B2 | 9/2006 | Halford |
| 7,103,915 | B2 | 9/2006 | Redlich et al. |
| 7,111,115 | B2 | 9/2006 | Peters et al. |
| 7,140,044 | B2 | 11/2006 | Redlich et al. |
| 7,146,644 | B2 | 12/2006 | Redlich et al. |
| 7,171,493 | B2 | 1/2007 | Shu et al. |
| 7,222,133 | B1 | 5/2007 | Raipurkar et al. |
| 7,240,236 | B2 | 7/2007 | Cutts et al. |
| 7,272,613 | B2 | 9/2007 | Sim et al. |
| 7,636,724 | B2 | 12/2009 | de la Torre et al. |
| 9,576,018 | B2 * | 2/2017 | Resch ................ G06F 11/1076 |
| 2002/0062422 | A1 | 5/2002 | Butterworth et al. |
| 2002/0166079 | A1 | 11/2002 | Ulrich et al. |
| 2003/0018927 | A1 | 1/2003 | Gadir et al. |
| 2003/0037261 | A1 | 2/2003 | Meffert et al. |
| 2003/0065617 | A1 | 4/2003 | Watkins et al. |
| 2003/0084020 | A1 | 5/2003 | Shu |
| 2004/0024963 | A1 | 2/2004 | Talagala et al. |
| 2004/0122917 | A1 | 6/2004 | Menon et al. |
| 2004/0215998 | A1 | 10/2004 | Buxton et al. |
| 2004/0228493 | A1 | 11/2004 | Ma et al. |
| 2005/0100022 | A1 | 5/2005 | Ramprashad |
| 2005/0114594 | A1 | 5/2005 | Corbett et al. |
| 2005/0125593 | A1 | 6/2005 | Karpoff et al. |
| 2005/0131993 | A1 | 6/2005 | Fatula, Jr. |
| 2005/0132070 | A1 | 6/2005 | Redlich et al. |
| 2005/0144382 | A1 | 6/2005 | Schmisseur |
| 2005/0229069 | A1 | 10/2005 | Hassner |
| 2005/0273686 | A1 * | 12/2005 | Turner ................ G06F 11/1076 714/752 |
| 2006/0047907 | A1 | 3/2006 | Shiga et al. |
| 2006/0136448 | A1 | 6/2006 | Cialini et al. |
| 2006/0156059 | A1 | 7/2006 | Kitamura |
| 2006/0224603 | A1 | 10/2006 | Correll, Jr. |
| 2007/0079081 | A1 | 4/2007 | Gladwin et al. |
| 2007/0079082 | A1 | 4/2007 | Gladwin et al. |
| 2007/0079083 | A1 | 4/2007 | Gladwin et al. |
| 2007/0088970 | A1 | 4/2007 | Buxton et al. |
| 2007/0174192 | A1 | 7/2007 | Gladwin et al. |
| 2007/0214285 | A1 | 9/2007 | Au et al. |
| 2007/0234110 | A1 | 10/2007 | Soran et al. |
| 2007/0283167 | A1 | 12/2007 | Venters, III et al. |
| 2009/0094251 | A1 | 4/2009 | Gladwin et al. |
| 2009/0094318 | A1 | 4/2009 | Gladwin et al. |
| 2010/0023524 | A1 | 1/2010 | Gladwin et al. |
| 2012/0166867 | A1 * | 6/2012 | Volvovski ............... G06F 3/064 714/6.22 |
| 2013/0232307 | A1 * | 9/2013 | Clifone ............... G06F 11/1076 711/154 |
| 2015/0193309 | A1 * | 7/2015 | Khadiwala .......... G06F 11/3034 714/4.11 |
| 2017/0201274 | A1 * | 7/2017 | Dhuse ................... G06F 3/0641 |
| 2017/0346900 | A1 * | 11/2017 | Baptist .................... H04L 67/02 |
| 2018/0004427 | A1 * | 1/2018 | Baptist ................. G06F 3/0611 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; Fast2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

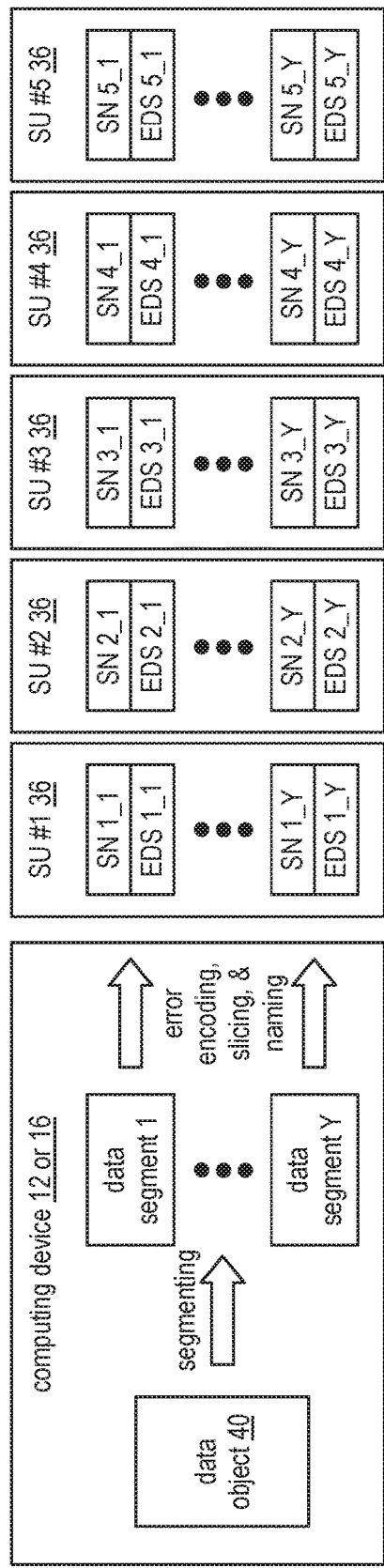
FIG. 3
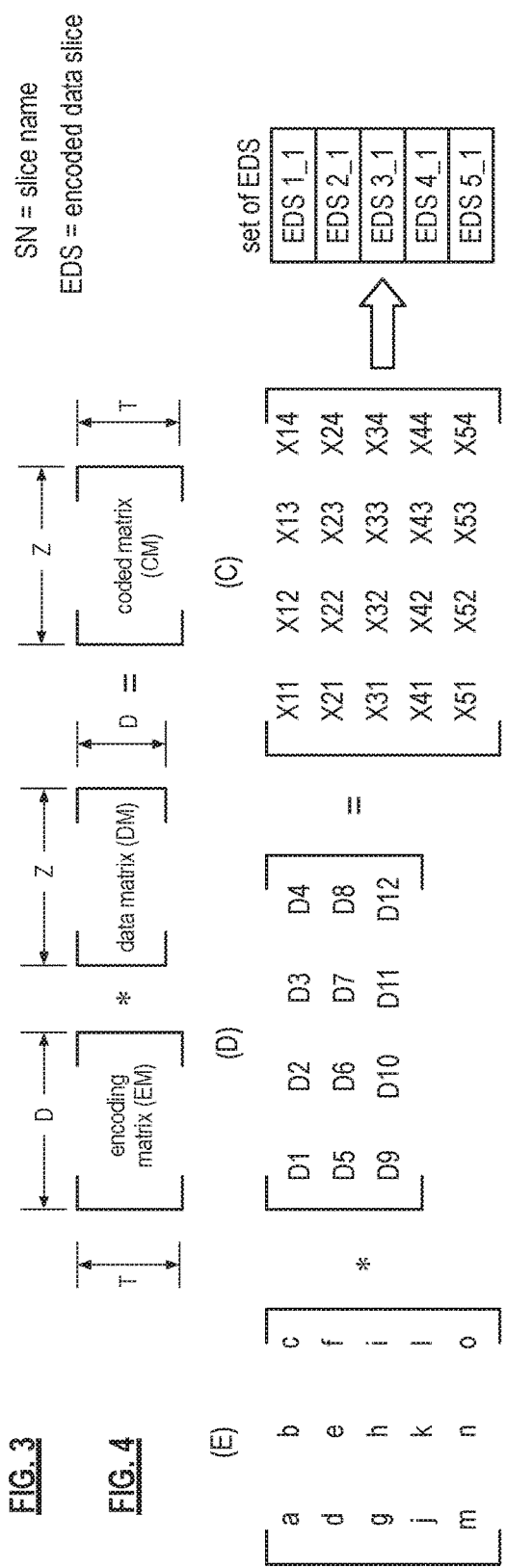
FIG. 4
FIG. 5
FIG. 6

NON-WRITING DEVICE FINALIZATION OF A WRITE OPERATION INITIATED BY ANOTHER DEVICE

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

Within a dispersed storage network (DSN), writing of a data segment of a data object is done in a three-phase process. In the first phase, the writing device sends a set of write requests to a set of storage unit of the DSN that is to store a set of encoded data slices (e.g., an encoded data segment). Each storage unit that receives a write request temporarily stores an encoded data slice of the write request, keeps it from being accessible, and sends a write response. When the writing device receives a write threshold number of favorable write responses, it sends a set of write commit requests (i.e., the second phase). Each storage unit that receives a write commit request permanently stores the encoded data slice, makes the encoded data accessible, and sends a write commit response. After the second phase is completed (at least up to a write threshold), the set of encoded data slices are accessible to any authorized device in the DSN.

In the third phase of a write operation, the writing device sends a set of write finalize commands to the storage units. The write finalize commands indicate that the newly stored set of encoded data slices is valid and may further indicate what the storage units should do with older versions of the set of encoded data slices (e.g., delete, archive, store, etc.). After the second phase is complete and prior to completion of the third phase, devices can access the set of encoded data slices but must verify the set prior to utilizing it. As such, each device that accesses the set of encoded data slices prior to completion of the third phase of the write operation must independently verify the set of encoded data slice. This is also true for fast write operations, which modify the first and second phases into one phase.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
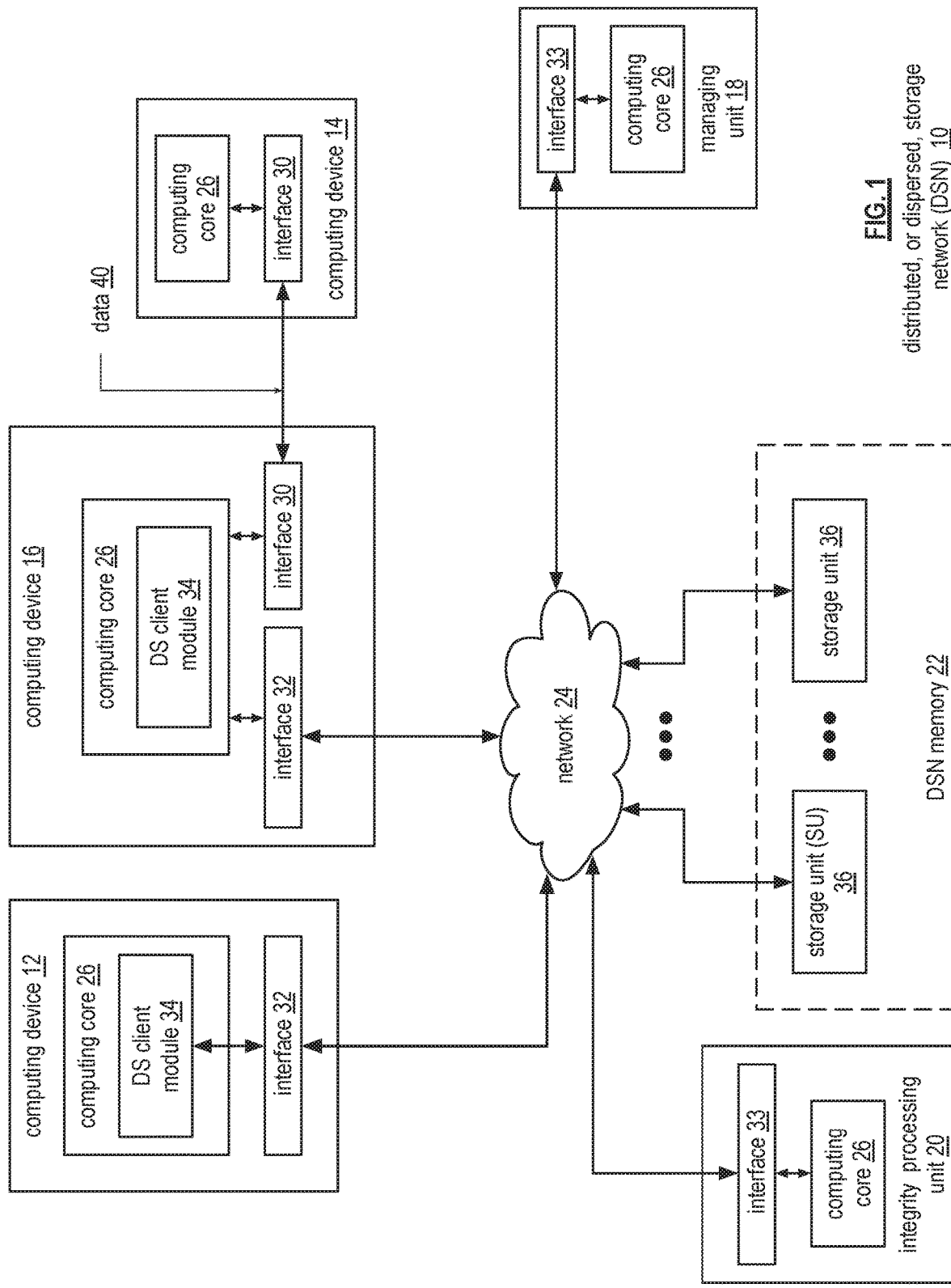
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
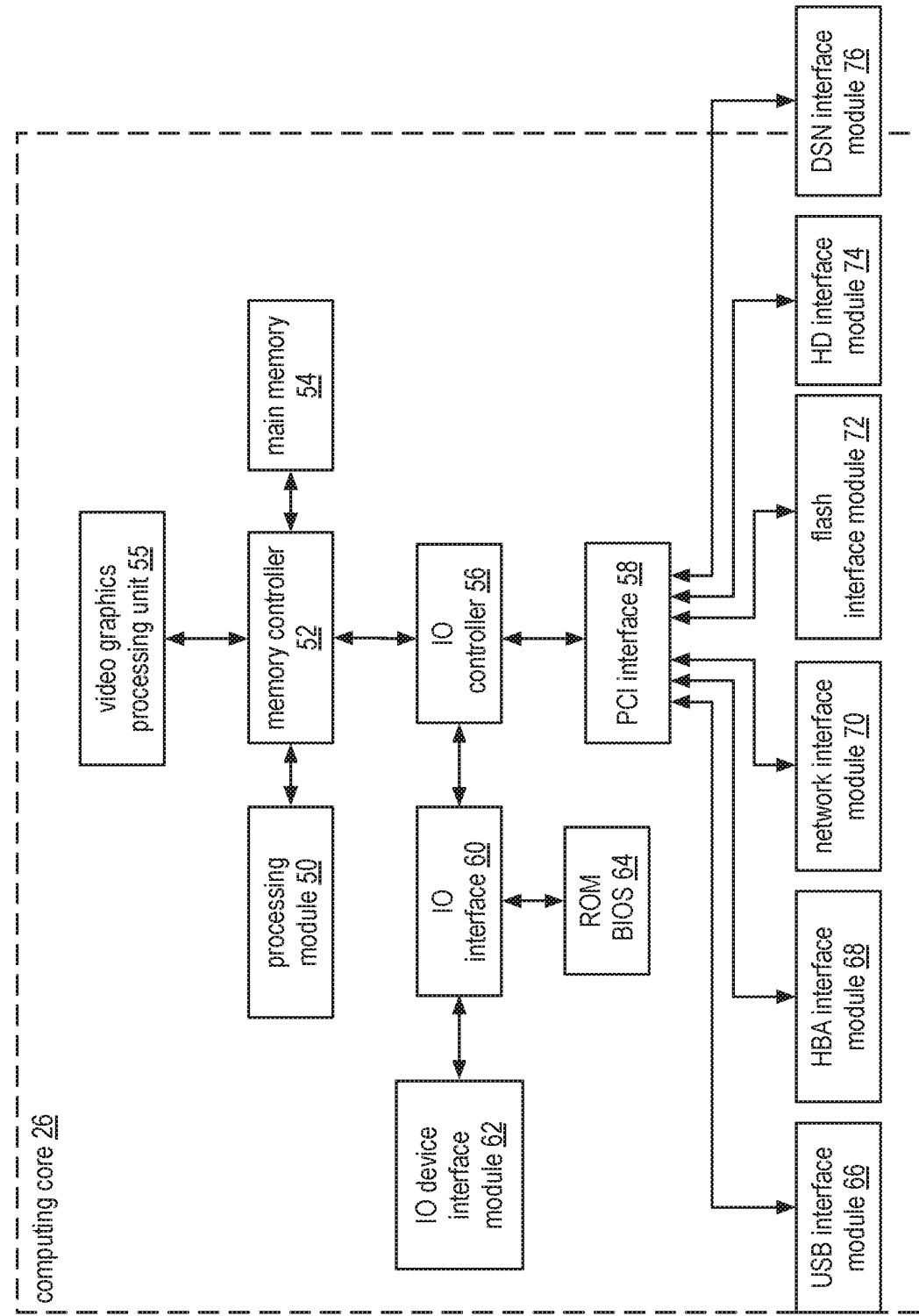
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (IO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
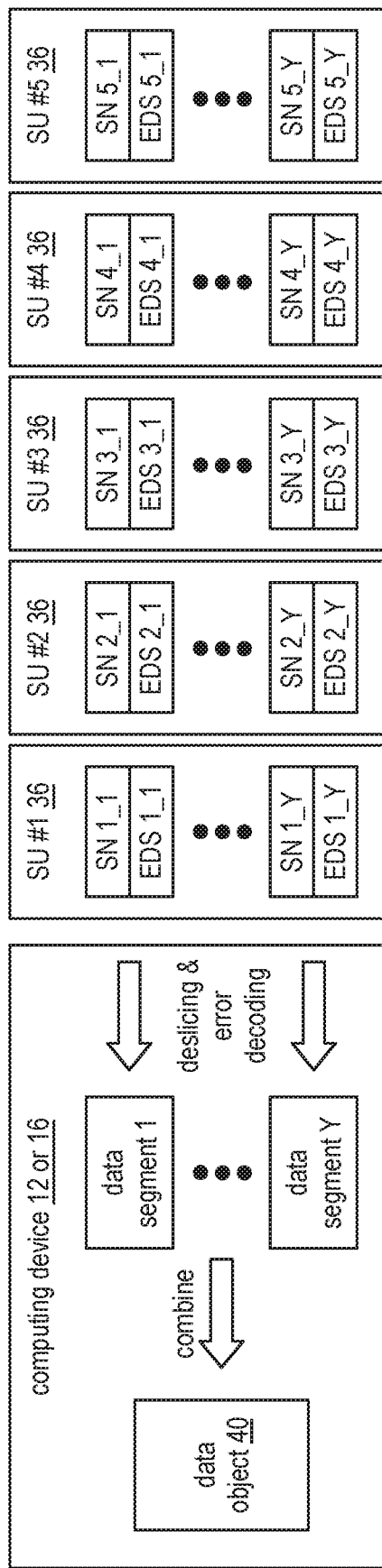
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
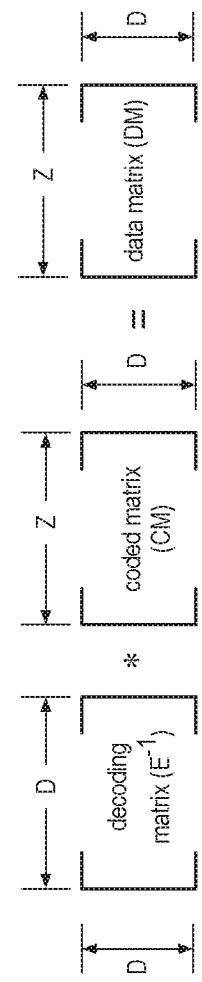
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
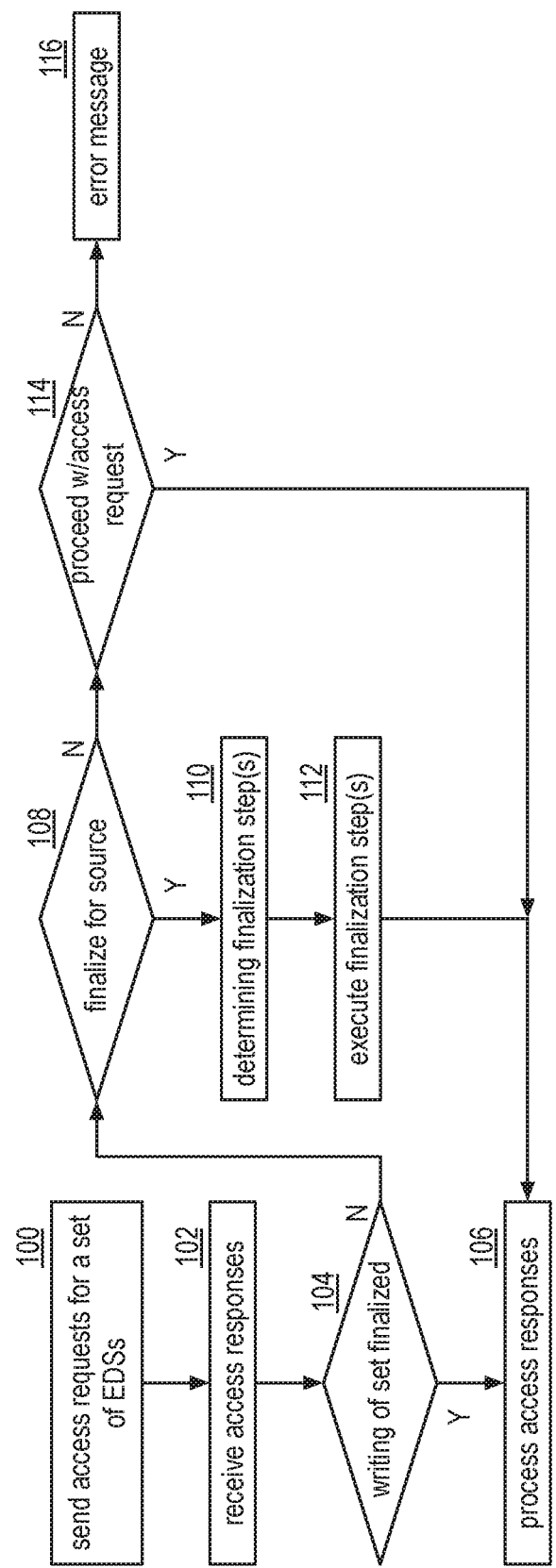
FIG. 9 is a logic diagram of an example of a method of finalizing a write operation starting by another device in accordance with the present invention.

FIG. 9 is a logic diagram of an example of a method of finalizing a write operation starting by another device that starts at step 100 where a computing device send a read threshold number of access requests to storage units of the DSN regarding a set of encoded data slices. As an example, the access request is a read request, a list request (e.g., a request for a list of slice names of encoded data slices that are stored in storage units), and/or a check overwrite (e.g., editing of existing encoded data slices, status check, etc.).

Recall that a data segment of a data object is dispersed storage error encoded into a set of encoded data slices (EDSs) in accordance with dispersed storage error encoding parameters. The parameters include a pillar width (i.e., the total number of EDSs in a set), a decode threshold (i.e., the minimum number of EDSs needed to recover the data segment), a write threshold (i.e., the minimum number of EDSs that need to be successfully stored for a write operation to be deemed successful), a read threshold (i.e., the number of requests for a set of EDS to be retrieved from storage units), and an encoding function. Typically, the read threshold is between the decode threshold and the write threshold.

The method continues at step 102 where the computing device receives access responses from at least some of the storage units in response to the read threshold number of access requests. The method continues at step 104 where the computing device determines, from the access responses, whether writing of the set of encoded data slices to a set of storage units has been finalized. For example, the computing device determines whether at least a write threshold number of storage units have provided a finalize response to a write operation of the set of encoded data slices. Note that the write operation may be a three phase write operation or a fast write operation.

When the write operation has been finalized, the method continues at step 106 where the computing device processes the access responses. For example, the computing device decodes encoded data slices to recover the data segment. When the write operation has not been finalized, the computing device determines whether it can finalize the write operation for the source (i.e., the device that initiated the write operation for the set of encoded data slices). Various examples of making a finalizing determination are discussed below with reference to FIGS. 10 and 11.

If the computer device determines that it cannot finalize the write operation, the method continues at step 114 where the computing device determines whether it can proceed with the processing of the access responses. If not, the method continues at step 116 where the computing device generates an error message. If the computing device determines it can proceed, the method continues at step 106 where the computing device processes the access responses. For example, the computing device receives a decoded threshold number of encoded data slices for a read request, but a write threshold number of storage units are unavailable to finalize the write operation. In this example, the computing device recovers the data segment from the decode threshold number of encoded data slices, but does not finalize the write operation. The computing device then verifies the recovered data segment to ensure that is the desired revision level of the data segment, it is an uncorrupted data segment, it is an authentic data segment, and/or other verification processes.

When the computing device determines that it can finalize the writing of the sets of encoded data slices, the method continues at step 110 where the computing device determines one or more finalization steps for completing the writing of the set of encoded data slices. The method continues at step 112 where the computing device executes the one or more finalization steps to complete the writing of the set of encoded data slices. For example, the computing device determines that finalize commands need to be sent to the storage units to finalize the write operation. As another example, the computing device determines that one or more encoded data slices need to be rebuild and stored to achieve at least a write threshold. In this example, the computing device rebuilds the encoded data slices, issues write commands for them, and, once successfully stored, issues finalize commands to the storage units.

Figure 10:
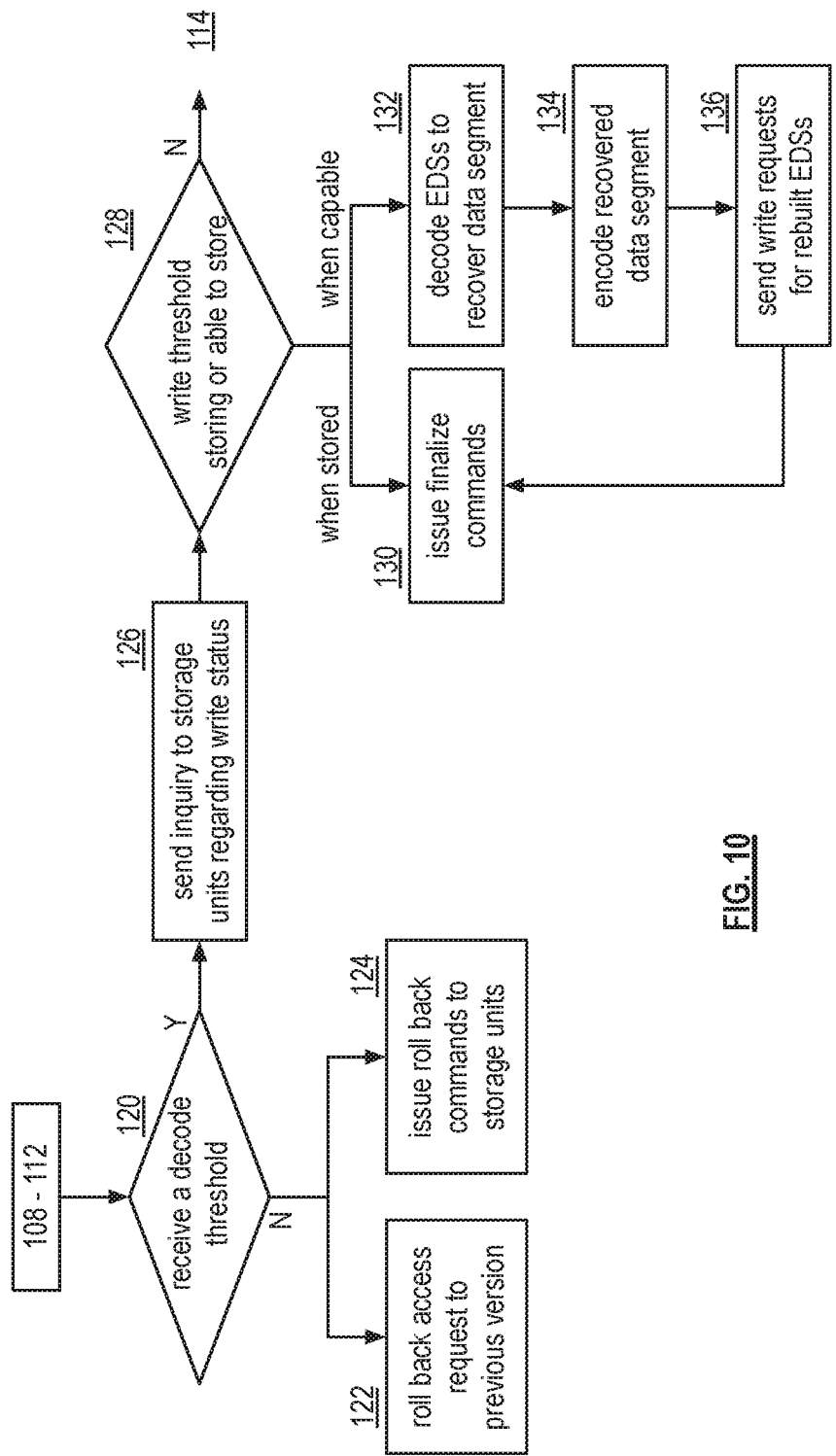
FIG. 10 is a logic diagram of an example of one or more steps of FIG. 9 in accordance with the present invention.

FIG. 10 is a logic diagram of an example of steps 108-112 of FIG. 9 that begins at step 120 where the computing device determines whether a decode threshold number of favorable access responses were received (e.g., received a decoded threshold number of encoded data slices for a read operation). If not, the method continues at step 122 and/or at step 124. At step 122, the computing device rolls back the read threshold number of access requests to request a previous version of the set of encoded data slices. For example, the computing device determines that a most current set of encoded data slices is not the set for which the write operation has not been finalized, but a previous revision level of the set of encoded data slices for which a write operation has been finalized. At step 124, the computing device issues a set of rollback commands to the set of storage units regarding the set of encoded data slices. In response, the storage units delete their respective encoded data slices of the set of encoded data slices for which the write operation was not finalized; making the previous revision level of encoded data slices the most current.

When at least the decode threshold number of favorable access responses have been received, the method continues at step 126 where the computing device sends an inquiry to other storage units regarding write status of writing encoded data slices of the set. This inquiry is to determine whether at least a write threshold number of storage units are available to successfully store encoded data slices of the set. For example, if the decode threshold is 10, the pillar width is 16, and the write threshold is 13, the computing device inquires of the six storage units (the ones that did not send an encoded data slice of the decode threshold number of encoded data slices) to see if three are available.

The method continues at step 128 where the computing device determines, from the inquiry, whether a write threshold number of storage units has successfully stored or is capable of successfully storing a write threshold number of encoded data slices of the set. If not, the method continues at step 114 of the FIG. 9. When the write threshold number of storage units have successfully stored the write threshold number of encoded data slices, the method continues at step 130 where the computing device issues a set of write finalize requests to the set of storage units regarding the set of encoded data slices.

When the write threshold number of storage units of the set of storage units is capable of successfully storing the write threshold number of encoded data slices, the method continues at step 132 where the computing device dispersed storage error decodes the decode threshold number of encoded data slices to recover the data segment. The method continues at step 134 where the computing device dispersed storage error encodes the data segment to produce a new set of encoded data slices. The computing device selects one or more encoded data slices of the new set as rebuilt encoded data slices for the original set of encoded data slices. The method continues at step 136 where the computing device sends write requests to the other storage units regarding the rebuilt encoded data slices. Once the rebuilt encoded data slices are stored, the method continues at step 130 where the computing device issues finalize commands.

Figure 11:
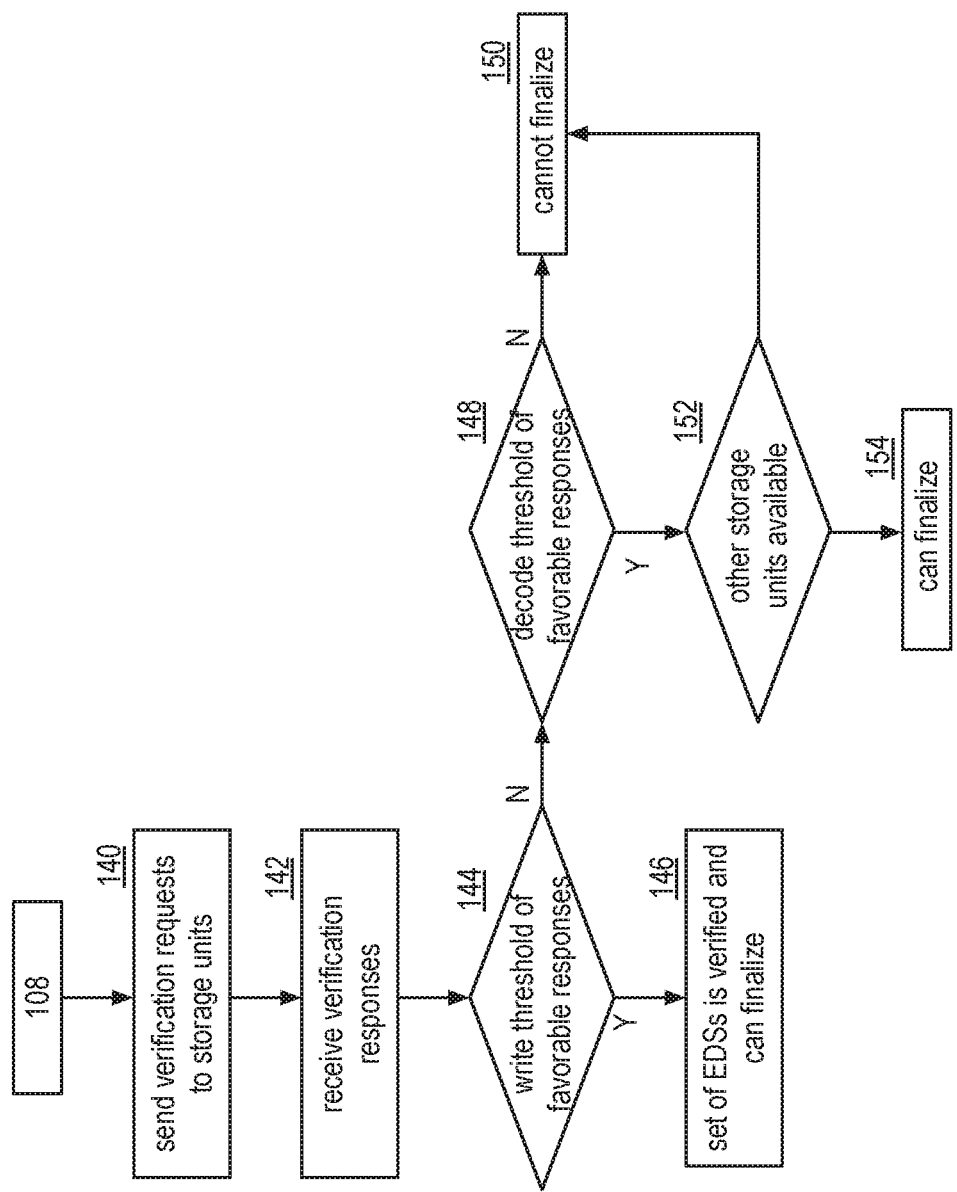
FIG. 11 is a logic diagram of another example of one or more steps of FIG. 9 in accordance with the present invention.

FIG. 11 is a logic diagram of another example of step 108 of FIG. 9 that begins at step 140 where the computing device sends verification requests to the set of storage units regarding at least one of the source and the set of encoded data slices. For example, as part of determining whether to finalize the write operation, the computing device is verifying the source of the write request (e.g., another computing device of the DSN) and/or of the set of encoded data slices for authenticity, corruption, and/or other verifiable characteristics of a source and/or of data. The method continues at step 142 where the computing device receives verification responses from at least some of the storage units.

The method continues at step 144 where the computing determines whether a write threshold number of favorable verification responses have been received. If yes, the method continues at step 146 where the computing device indicated that the source and/or the set of encoded data slices has been verified and that the computing device can finalize the writing.

When less than a write threshold of favorable responses has been received, the method continues at step 148 where the computing device determines whether a decode threshold number of favorable verification responses have been received. If not, the method continues at step 150 where the computing determines it cannot finalize the write operation. If at least a decode threshold of favorable verification responses have been received, the method continues at step 152 where the computing device determines whether other storage units are available to produce at least the write threshold number of storage units. If not, the method continues at step 150. If yes, the method continues at step 154 where the computing device determines that it can finalize the writing of the set of encoded data slices (i.e., finalize the write operation).

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by infer- ence) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A computer-implemented method for execution by a computing device of a dispersed storage network (DSN), the method comprises:
    sending, by the computing device, a read threshold number of access requests to storage units of the DSN regarding a set of encoded data slices, wherein the storage units of the DSN have not yet received a write finalize command from a source computer to finalize the writing of the set of encoded data slices;
    receiving, by the computing device, access responses from at least some of the storage units in response to the read threshold number of access requests;
    determining, by the computing device from the access responses, that the writing of the set of encoded data slices to a set of storage units of the DSN by the source computer has not been finalized;
    determining, by the computing device, whether the computing device can finalize the writing of the set of encoded data slices on behalf of the source computer of the DSN that initiated the writing of the set of encoded data slices, wherein the source computer is another computing device of the DSN; and
    in response to determining that the computing device can finalize the writing of the sets of encoded data slices:
        determining, by the computing device, one or more finalization steps for completing the writing of the set of encoded data slices; and
        executing, by the computing device, the one or more finalization steps to complete the writing of the set of encoded data slices.

2. The computer-implemented method of claim 1, wherein the access requests comprise one of:
    read requests;
    list requests; and
    checked overwrites.

3. The computer-implemented method of claim 1 further comprises:
    the determining whether the computing device can finalize the writing including:
        determining that a decode threshold number of favorable access responses were received from a decode threshold number of storage units of the set of storage units;
        when the at least the decode threshold number of favorable access responses were received, sending an inquiry to other storage units of the set of storage units regarding write status of writing other encoded data slices of the set of encoded data slices, wherein the decode threshold number of encoded data slices does not include the other encoded data slices;

determining, from the inquiry and the decoded threshold number of favorable access responses, whether a write threshold number of storage units of the set of storage units has successfully stored or is capable of successfully storing a write threshold number of encoded data slices of the set of encoded data slices; and the executing the one or more finalization steps including, when the write threshold number of storage units of the set of storage units have successfully stored the write threshold number of encoded data slices, issuing a set of write finalize requests to the set of storage units regarding the set of encoded data slices.

4. The computer-implemented method of claim 3 further comprises: when the at least the decode threshold number of favorable access responses were not received, rolling back the read threshold number of access requests to request a previous version of the set of encoded data slices.

5. The computer-implemented method of claim 3 further comprises: when the at least the decode threshold number of favorable access responses were not received, issuing a set of rollback commands to the set of storage units regarding the set of encoded data slices.

6. The computer-implemented method of claim 3, wherein the executing the one or more finalization steps comprises:

when the write threshold number of storage units of the set of storage units is capable of successfully storing the write threshold number of encoded data slices:
dispersed storage error decoding the decode threshold number of encoded data slices to recover a data segment of a data object;
dispersed storage error encoding the data segment to produce a new set of encoded data slices; and
sending write requests to the other storage units, wherein the write requests includes new other encoded data slices from the new set of encoded data slices.

7. The computer-implemented method of claim 1, wherein the determining whether the computing device can finalize the writing of the set of encoded data slices on behalf of the source computer comprises:

sending verification requests to the set of storage units regarding at least one of the source computer and the set of encoded data slices;
receiving verification responses from at least some of the storage units of the set of storage units; and
when a write threshold number of favorable verification responses have been received, indicating that the at least one of the source computer and the set of encoded data slices has been verified and that the computing device can finalize the writing.

8. The computer-implemented method of claim 7 further comprises:

when the write threshold number of favorable verification responses have not been received, determining whether a decode threshold number of favorable verification responses have been received;
when the decode threshold number of favorable verification responses have not been received, determining that the computing device cannot finalize the writing;
when the decode threshold number of favorable verification responses have been received, determining whether other storage units are available to produce at least the write threshold number of storage units; and
when the other storage units are available to produce at least the write threshold number of storage units, determining that the computing device can finalize the writing.

9. The computer-implemented method of claim 1, wherein the executing the one or more finalization steps to complete the writing of the set of encoded data slices comprises issuing, by the computing device, finalize commands to the storage units of the DSN to complete the writing of the set of encoded data slices.

10. The computer-implemented method of claim 1, further comprising decoding, by the computing device, the set of encoded data slices.

11. A computing device of a dispersed storage network (DSN), the computing device comprises: an interface; memory; and a processing module operably coupled to the interface and to the memory, wherein the processing module is operable to:

send, via the interface, a read threshold number of access requests to storage units of the DSN regarding a set of encoded data slices, wherein at least a portion of the storage units of the DSN have not yet provided a finalize response to a source computer to finalize the writing of the set of encoded data slices;
receive, via the interface, access responses from at least some of the storage units in response to the read threshold number of access requests;
determine, from the access responses, that the writing of the set of encoded data slices to a set of storage units of the DSN by the source computer has not been finalized;
determine whether the computing device can finalize the writing of the set of encoded data slices on behalf of the source computer of the DSN that initiated the writing of the set of encoded data slices, wherein the source computer is another computing device of the DSN;
when the computing device can finalize the writing of the sets of encoded data slices:
determine one or more finalization steps for completing the writing of the set of encoded data slices; and
execute the one or more finalization steps to complete the writing of the set of encoded data slices.

12. The computing device of claim 11, wherein the access requests comprise one of:
read requests;
list requests; and
checked overwrites.

13. The computing device of claim 11, wherein the processing module is further operable to:
determine the writing has not been finalized by:
determining that a decode threshold number of favorable access responses were received from a decode threshold number of storage units of the set of storage units;
when the at least the decode threshold number of favorable access responses were received, sending, via the interface, an inquiry to other storage units of the set of storage units regarding write status of writing other encoded data slices of the set of encoded data slices, wherein the decode threshold number of encoded data slices does not include the other encoded data slices;
determining, from the inquiry and the decoded threshold number of favorable access responses, whether a write threshold number of storage units of the set of storage units has successfully stored or is capable of successfully storing a write threshold number of encoded data slices of the set of encoded data slices; and execute the one or more finalization steps by, when the write threshold number of storage units of the set of storage units have successfully stored the write threshold number of encoded data slices, issuing a set of write finalize requests to the set of storage units regarding the set of encoded data slices.

14. The computing device of claim 13, wherein the processing module is further operable to: when the at least the decode threshold number of favorable access responses were not received, roll back the read threshold number of access requests to request a previous version of the set of encoded data slices.

15. The computing device of claim 13, wherein the processing module is further operable to: when the at least the decode threshold number of favorable access responses were not received, issue, via the interface, a set of rollback commands to the set of storage units regarding the set of encoded data slices.

16. The computing device of claim 13, wherein the processing module is further operable to execute the one or more finalization steps by:
when the write threshold number of storage units of the set of storage units is capable of successfully storing the write threshold number of encoded data slices:
dispersed storage error decoding the decode threshold number of encoded data slices to recover a data segment of a data object;
dispersed storage error encoding the data segment to produce a new set of encoded data slices; and
sending, via the interface, write requests to the other storage units, wherein the write requests includes new other encoded data slices from the new set of encoded data slices.

17. The computing device of claim 11, wherein the processing module is further operable to determine whether the computing device can finalize the writing of the set of encoded data slices on behalf of the source computer by:
sending, via the interface, verification requests to the set of storage units regarding at least one of the source computer and the set of encoded data slices;
receiving, via the interface, verification responses from at least some of the storage units of the set of storage units; and
when a write threshold number of favorable verification responses have been received, indicating that the at least one of the source computer and the set of encoded data slices has been verified and that the computing device can finalize the writing.

18. The computing device of claim 17, wherein the processing module is further operable to:
when the write threshold number of favorable verification responses have not been received, determine whether a decode threshold number of favorable verification responses have been received;
when the decode threshold number of favorable verification responses have not been received, determine that the computing device cannot finalize the writing;
when the decode threshold number of favorable verification responses have been received, determine whether other storage units are available to produce at least the write threshold number of storage units; and
when the other storage units are available to produce at least the write threshold number of storage units, determine that the computing device can finalize the writing.

19. The computing device of claim 11, wherein the executing the one or more finalization steps to complete the writing of the set of encoded data slices comprises issuing finalize commands to the storage units of the DSN to complete the writing of the set of encoded data slices.

20. The computing device of claim 11, wherein the processing module is further operable to decode the set of encoded data slices.

* * * * *